(12) United States Patent
Lee (10) Patent No.: US 7,813,215 B2
(45) Date of Patent: Oct. 12, 2010

(54) CIRCUIT AND METHOD FOR GENERATING DATA OUTPUT CONTROL SIGNAL FOR SEMICONDUCTOR INTEGRATED CIRCUIT

(75) Inventor: Dong-Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/502,436

(22) Filed: Jul. 14, 2009

(65) Prior Publication Data

US 2010/0039878 A1 Feb. 18, 2010

Related U.S. Application Data

(62) Division of application No. 11/822,656, filed on Jul. 9, 2007, now Pat. No. 7,570,542.

(30) Foreign Application Priority Data

Nov. 13, 2006 (KR) ...................... 10-2006-0111431

(51) Int. Cl.
*G11C 8/00* (2006.01)
(52) U.S. Cl. .............................. 365/233.1; 365/233.11; 365/230.02; 365/230.01; 365/233.5; 365/236
(58) Field of Classification Search .............. 365/233.1, 365/233.11, 230.02, 230.01, 233.5, 236
See application file for complete search history.

(56) References Cited

U.S. PATENT DOCUMENTS

| 6,166,990 | A | 12/2000 | Ooishi et al. | |
|---|---|---|---|---|
| 6,222,406 | B1 | 4/2001 | Noda et al. | |
| 6,337,832 | B1 * | 1/2002 | Ooishi et al. | ............ 365/233.12 |
| 6,404,258 | B2 * | 6/2002 | Ooishi | ......................... 327/278 |
| 6,414,530 | B2 | 7/2002 | Noda et al. | |
| 6,446,180 | B2 | 9/2002 | Li et al. | |
| 6,707,759 | B2 | 3/2004 | Song | |
| 6,763,079 | B1 | 7/2004 | Iwamoto | |
| 6,819,624 | B2 | 11/2004 | Acharya et al. | |
| 6,853,226 | B2 * | 2/2005 | Kwak et al. | .................. 327/159 |
| 6,920,080 | B2 | 7/2005 | Chung et al. | |
| 6,944,092 | B2 * | 9/2005 | Kang | ..................... 365/233.13 |
| 6,977,848 | B2 | 12/2005 | Choi | |
| 6,982,924 | B2 | 1/2006 | Na | |
| 6,987,705 | B2 | 1/2006 | Kim et al. | |

(Continued)

FOREIGN PATENT DOCUMENTS

JP 2004327008 11/2004

(Continued)

*Primary Examiner*—Viet Q Nguyen
(74) *Attorney, Agent, or Firm*—Venable LLP; Jeffri A. Kaminski (57) ABSTRACT

The data output control signal generating circuit includes a delay correction signal generating unit that delays an input signal by a phase difference between a clock and a delay locked loop clock, and latches the delayed signal to generate a plurality of output enable signals. A column address strobe latency control multiplexer selects the output enable signal corresponding to column address strobe latency among the plurality of output enable signals, on the basis of the signal obtained by delaying the input signal by the phase difference between the clock and the delay locked loop clock, and outputs the selected signal as the data output control signal.

10 Claims, 11 Drawing Sheets

U.S. PATENT DOCUMENTS

| | | |
|---|---|---|
| 7,027,336 B2 | 4/2006 | Lee |
| 7,081,784 B2 | 7/2006 | Kang |
| 7,245,551 B2 * | 7/2007 | Choi ..................... 365/189.08 |
| 7,369,445 B2 * | 5/2008 | Lee et al. ............... 365/189.04 |
| 7,443,741 B2 | 10/2008 | Butt et al. |
| 7,457,191 B2 | 11/2008 | Lee |
| 7,570,542 B2 * | 8/2009 | Lee ......................... 365/233.1 |

FOREIGN PATENT DOCUMENTS

| | | |
|---|---|---|
| KR | 1020050105557 | 11/2005 |
| KR | 1020060062426 | 6/2006 |

* cited by examiner

CIRCUIT AND METHOD FOR GENERATING DATA OUTPUT CONTROL SIGNAL FOR SEMICONDUCTOR INTEGRATED CIRCUIT

CROSS-REFERENCE TO RELATED PATENT APPLICATION

This application is a divisional of U.S. patent application Ser. No. 11/822,656, filed Jul. 9, 2007 now U.S. Pat. No.7,570,542, the subject matter of which application is incorporated herein by reference in its entirety.

This application claims the benefit of Korean Patent Application No. 10-2006-0111431, filed on Nov. 13, 2006, in the Korean Intellectual Property Office, the disclosure of which is incorporated herein in its entirety by reference.

BACKGROUND OF THE INVENTION

1. Technical Field

The present invention relates to a semiconductor integrated circuit, and more particularly, to a circuit and method for generating a data output control signal.

2. Related Art

Figure 1:
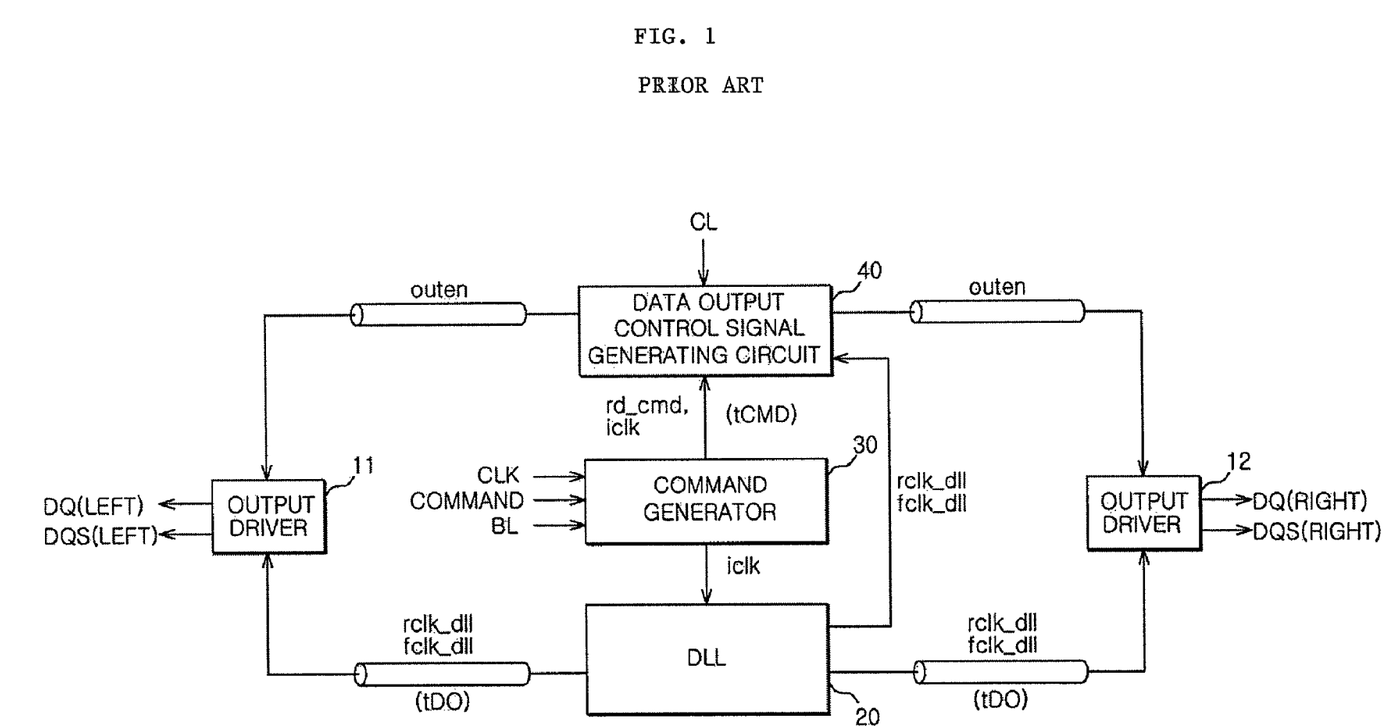
FIG. 1 is a block diagram illustrating a general data output control circuit of a semiconductor integrated circuit.

In general, as shown in FIG. 1, semiconductor integrated circuits include output drivers 11 and 12, a delay locked loop (DLL) 20, a command generator 30, and a data output control signal generating circuit 40.

Each of the output drivers 11 and 12 outputs data signals DQ and DQS in response to one of the delay locked loo clocks fclk_dll and rclk_dll corresponding to a data output control signal outen.

The delay locked loop 20 corrects the phase of an internal clock iclk such that the phase of an external clock CLK is synchronized with the phases of the data signals DQ and DQS to generate the delay locked loop clocks fclk_dll and rclk_dll.

The command generator 30 receives the external clock CLK and an external read command COMMAND synchronized with the external clock CLK and outputs an internal clock iclk and an internal read command rd_cmd of a burst length (BL).

The data output control signal generating circuit 40 receives the internal clock iclk and column address strobe (CAS) latency CL and outputs a data output control signal outen suitable for the column address strobe latency CL.

The CAS latency CL is information for determining the output position of data in the external clock CLK from the external read command READ.

A delay time tCMD exists until the internal read command rd_cmd reaches the data output control signal generating circuit 40. In addition, a delay time tDO exists until the delay locked loop clocks fclk_dll and rclk_dll output from the delay locked loop 20 reach the output drivers 11 and 12.

The delay locked loop 20 causes a phase difference −tDO between the delay locked loop clocks fclk_dll and rclk_dll and falling and rising edges of the external clock CLK in order to compensate for the delay time tDO.

Therefore, the data output control signal generating circuit 40 compensates for the delay locked loop clock fclk_dll to have a delay time tDO+tCMD, latches the internal read command rd_cmd, and compensates for the delay time tDO+tCMD through an internal circuit structure, thereby synchronizing the phase of the data output control signal outen with the phase of the external clock CLK. The reason why the delay locked loop clock fclk_dll is used to latch the internal read command rd_cmd is to obtain a timing margin of ½tCK.

Figure 2:
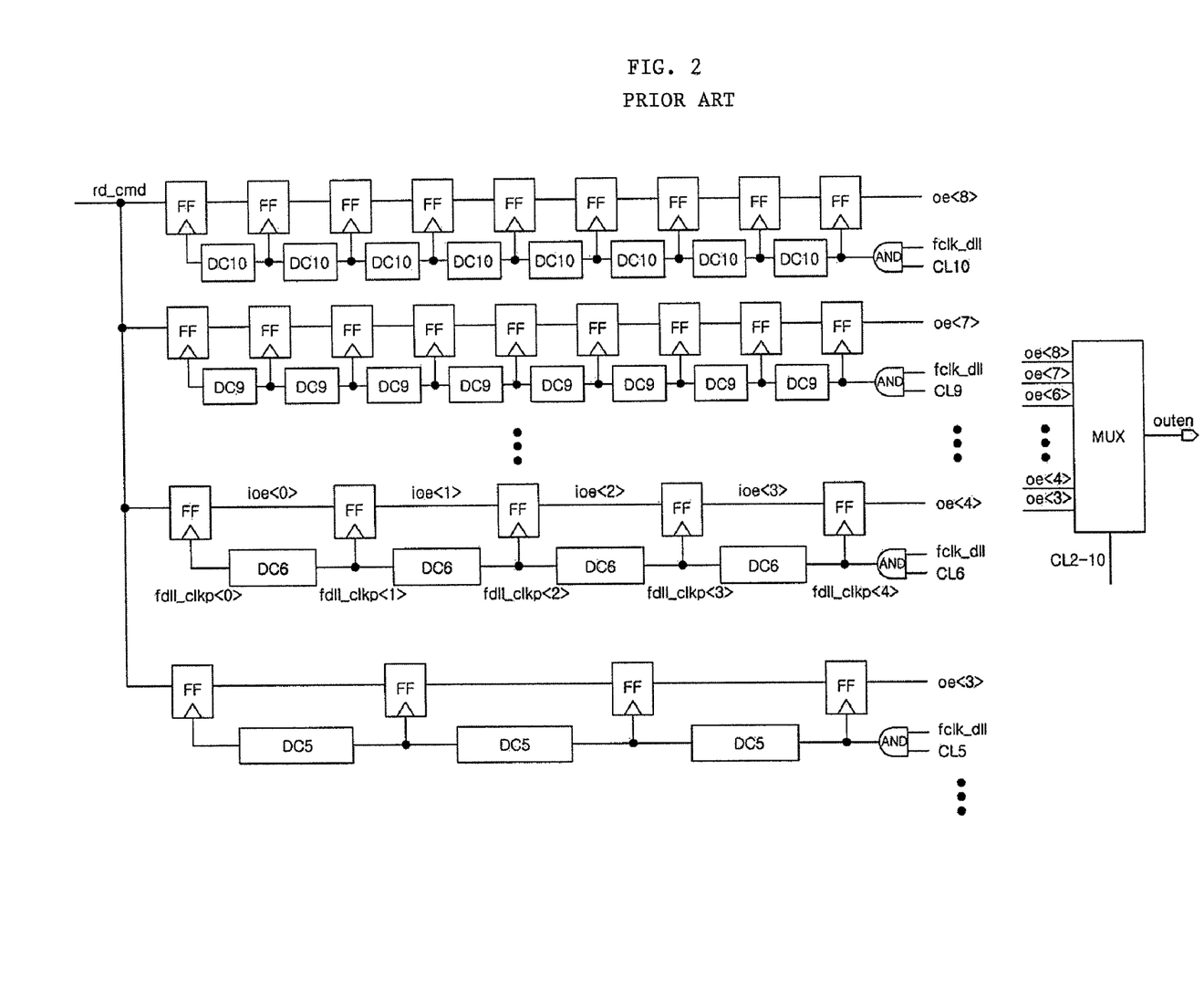
FIG. 2 is a block diagram illustrating a circuit for generating a data output control signal for a semiconductor integrated circuit according to the related art.

As such, the data output control signal generating circuit uses a data pre-fetch method. When the time required to convert parallel data into serial data is 2tCK, the data output control signal outen should be generated at a time (CL−2)*tCK. Therefore, as shown in FIG. 2, a general data output control signal generating circuit may include CL−1 flip-flops FF, CL−2 delay chains DC, and a plurality of AND gates AND for performing an AND operation of each CAS latency CL and the delay locked loop clock fclk_dll for each CAS latency CL. In addition, the data output control signal generating circuit includes a multiplexer MUX for selecting a signal corresponding to the CAS latency CL among data output control signals OE<3:8> output from circuits provided for each CAS latency CL and outputting the selected signal. For example, a circuit corresponding to CL6 includes an AND gate AND for performing an AND operation of CL6 and the delay locked loop clock fclk_dll, four delay chains DC6 for sequentially delaying an output signal of the AND gate AND, and five flip-flops FF for sequentially outputting the internal read command rd_cmd according to the output signal of the AND gate AND or output signals of the four delay chains DC6.

The sum of delay time of the delay chains for each CAS latency CL should be tDO+tCMD. Therefore, a delay time of one delay chain for each CAS latency CL is (tDO+tCMD)/CL−2.

Figure 3:
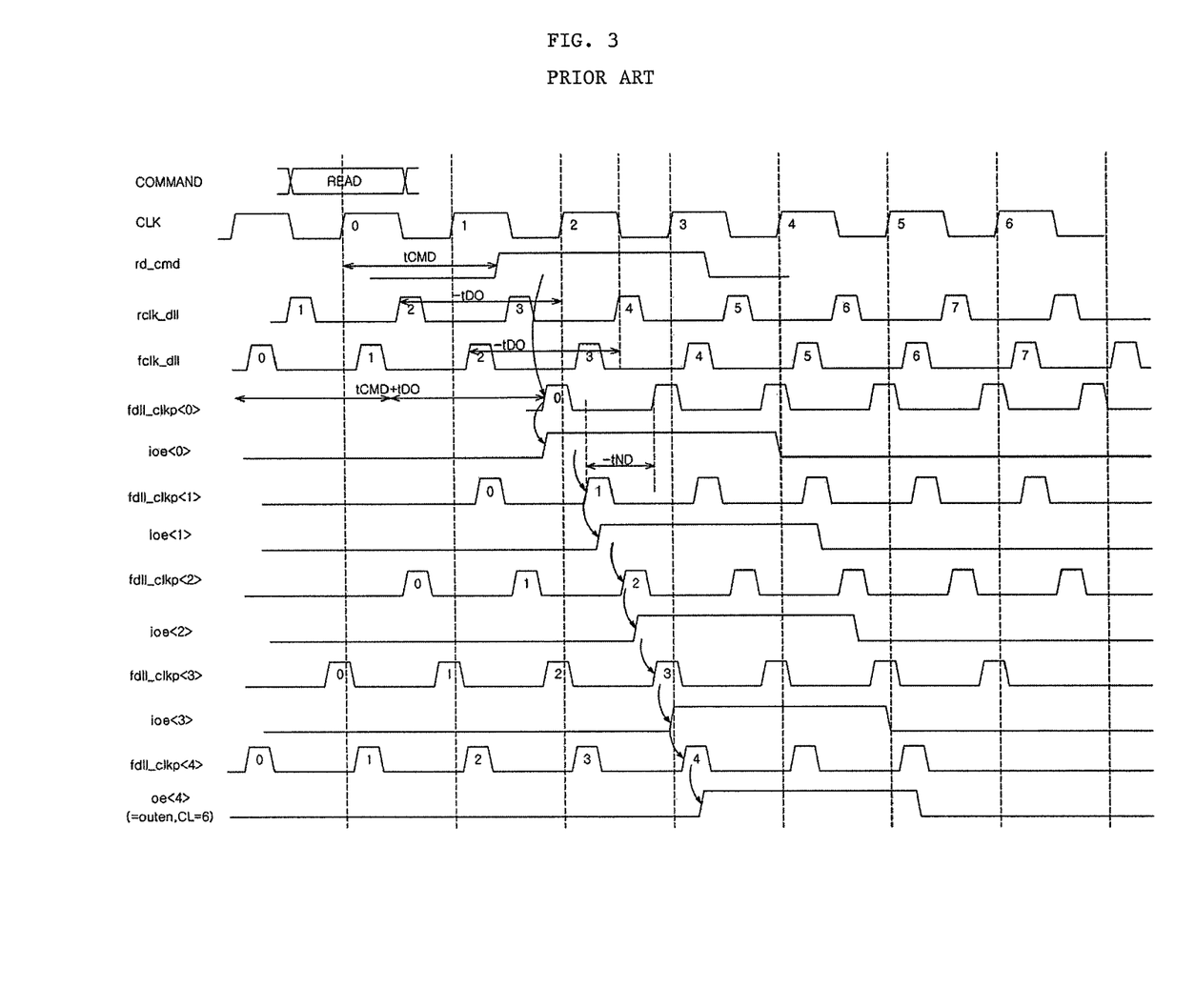
FIG. 3 is a timing chart for the circuit for generating a data output control signal for a semiconductor integrated circuit according to the related art.

Next, the operation of the data output control signal generating circuit according to the related art when CL is 6 will be described with reference to FIG. 3.

First, the AND gate AND outputs a fourth delay clock fdll_clkp<4>, and the four delay chains delay the signal by (tDO+tCMD)/4 to output zeroth to third delay clocks fdll_clkp<0:3>.

The zeroth to fourth delay clocks fdll_clkp<0:4> each have a delay of −tND, that is, (tDO+tCMD)/4.

The five flip-flops FF latch the internal read command rd_cmd and output the latched signal according to the zeroth to fourth delay clocks fdll_clkp<0:4>.

A fourth output enable signal oe<4> is output from the flip-flop FF, and the fourth output enable signal oe<4> is output as the data output control signal outen from the multiplexer MUX since CL is 6.

A phase difference tDO+tCMD occurs between the zeroth delay clock fclk_clkp<0> and the delay locked loop clock fclk_dll. Therefore, the data output control signal generating circuit according to the related art inversely compensates for a zeroth internal synchronization signal ioe<0> generated from the zeroth delay clock fclk_clkp<0> according to the first to third delay clocks fdll_clkp<1:3> to remove the phase difference tDO+tCMD, thereby outputting the fourth output enable signal oe<4>.

However, the data output control signal generating circuit of the semiconductor integrated circuit according to the related art has the following problems.

First, the delay clock fdll_clkp output from each delay chain needs to have a setup time tS and a hold time tH in order to latch each internal synchronization signal ioe. Since each delay clock fdll_clkp has a delay −tND, tCK>tNS+tS+tH should be satisfied. Therefore, when tCK is reduced, it is difficult to satisfy the above-mentioned relationship. As a result, there is a limitation on an available frequency.

Second, it is necessary to exactly divide the delay time of each delay chain into (tDO+tCMD)/CL−2. However, a modeled delay chain does not adapt to PVT (process, voltage, and temperature) variation, which makes it difficult to exactly divide the delay time. As a result, errors may occur in the phase of the data output control signal.

Last, CL−2 delay chains and CL−1 flip-flops are needed for each CAS latency CL. Therefore, as the CAS latency CL increases, the number of delay chains and the number of flip-flops become larger, which results in an increase in the layout area.

SUMMARY OF THE INVENTION

An embodiment of the present invention provides a circuit and method for generating a data output control signal for a semiconductor integrated circuit capable of widening an operable frequency range.

Another embodiment of the present invention provides a circuit and method for generating an exact data output control signal for a semiconductor integrated circuit regardless of a PVT (process, voltage, and temperature) variation.

Still another embodiment of the present invention provides a circuit and method for generating a data output control signal for a semiconductor integrated circuit capable of minimally reducing a layout area regardless of CAS latency CL.

According to an embodiment of the present invention, there is provided a circuit for generating a data output control signal for a semiconductor memory apparatus. The data output control signal generating circuit includes: a delay correction signal generating unit that delays an input signal by a phase difference between a clock and a delay locked loop clock, and latches the delayed signal to generate a plurality of output enable signals; and a column address strobe latency control multiplexer that selects the output enable signal corresponding to column address strobe latency among the plurality of output enable signals, on the basis of the signal obtained by delaying the input signal by the phase difference between the clock and the delay locked loop clock, and outputs the selected signal as the data output control signal.

According to another embodiment of the present invention, there is provided a method of generating a data output control signal for a semiconductor integrated circuit. The method includes: detecting a first phase difference between a clock and a delay locked loop clock; calculating a third phase difference between the clock and the delay locked loop clock, using the first phase difference and a second phase difference obtained by processing the delay locked loop clock and a read command; sequentially latching a signal obtained by delaying the read command by a time corresponding to the first phase difference according to the delay locked loop clock to generate a plurality of signals; and selecting one of the plurality of signals corresponding to the third phase difference and column address strobe latency information and outputting the selected signal as the data output control signal.

DESCRIPTION OF EXEMPLARY EMBODIMENT

A circuit and method for generating a data output control signal for a semiconductor integrated circuit according to an exemplary embodiment of the present invention will now be described in detail with reference to the accompanying drawings.

First, a technical principle 0will be described with reference to FIGS. 4A and 4B, before explaining an embodiment of the present invention.

Figure 4A:
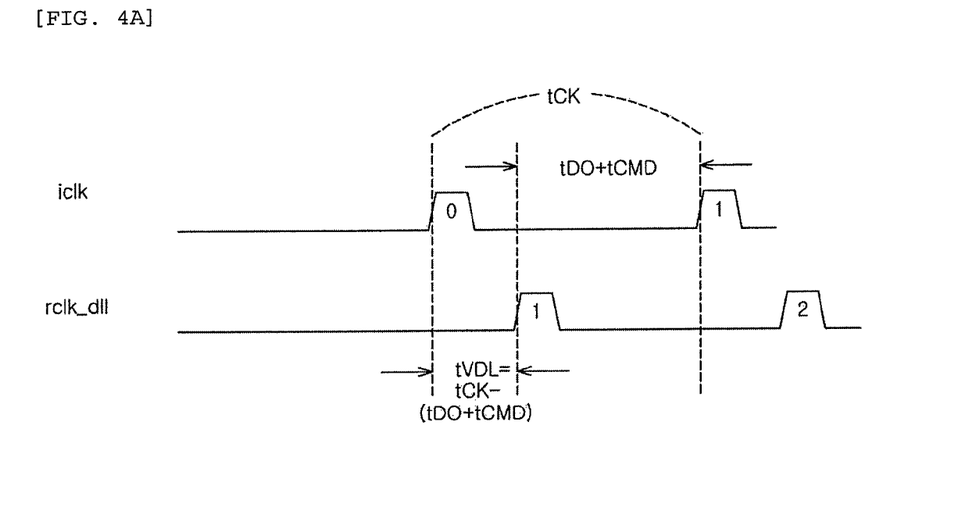
FIGS. 4A and 4B are waveform diagrams illustrating an operating principle of a circuit for generating a data output control signal for a semiconductor integrated circuit according to an embodiment of the present invention.

As shown in FIG. 4A, a phase difference tDO+tCMD is generated between an internal clock iclk<1> and a delay locked loop clock rclk_dll<1>. A delay tCMD is generated until an internal read command rd_cmd reaches a data output control signal generating circuit 40, and a delay tDO is generated until delay locked loop clocks fclk_dll and rclk_dll output from a delay locked loop 20 reach output drivers 11 and 12.

In addition, a delay corresponding to a variable delay tVDL exists between an internal clock iclk<0> and a delay locked loop clock rclk_dll<1> that are adjacent to each other.

As can be seen from FIG. 4A, the total sum of delays tVDL+tDO+tCMD corresponds to one period 1tCK of the internal clock iclk.

Figure 4B:
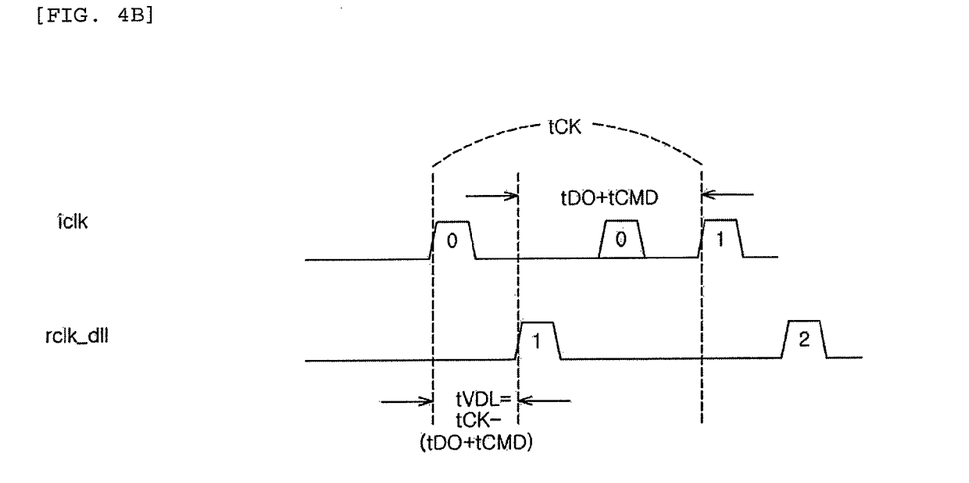

As can be seen from FIG. 4B, the total sum of delays tVDL+tDO+tCMD corresponds to two periods 2tCK of the internal clock iclk. The internal clock iclk and the delay locked loo clocks rclk_dll and fclk_dll have the same period tCK.

Therefore, as can be seen from FIGS. 4A and 4B, the total sum of delays tVDL+tDO+tCMD is equal to a multiple of one period of the internal clock iclk.

The delay tDO+tCMD is a fixed value, and the variable delay tVDL is a variable value. Therefore, in this embodiment of the invention, first, the variable delay tVDL is calculated, and then it is calculated how many times larger the sum of the variable delay tVDL and the delay tDO+tCMD is than one period tCK of the internal clock iclk. Then, a data output control signal outen corresponding to the delay locked loop clock fclk_dll is output.

Figure 5:
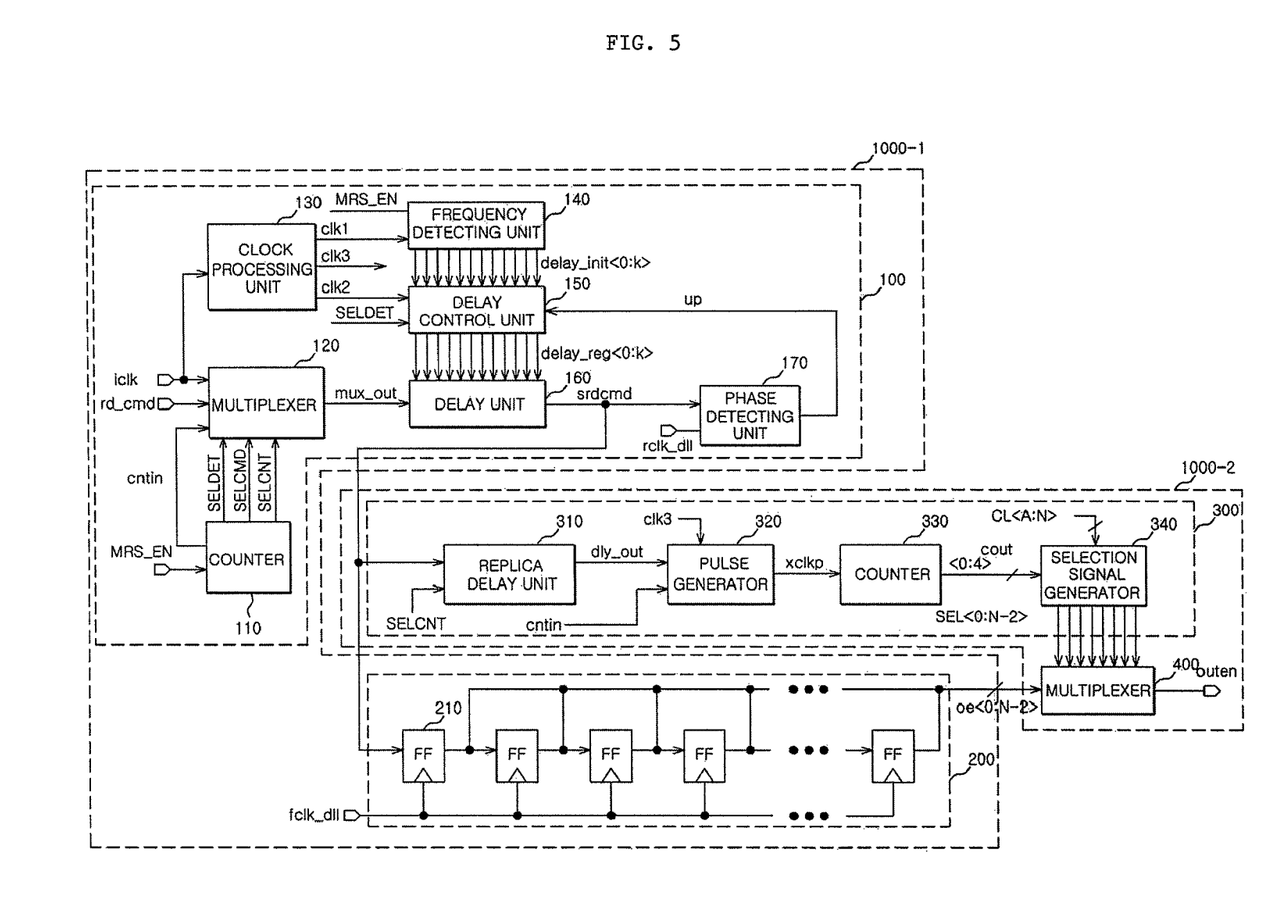
FIG. 5 is a block diagram illustrating the circuit for generating a data output control signal for a semiconductor integrated circuit according to an embodiment of the present invention.

As shown in FIG. 5, a circuit for generating a data output control signal for a semiconductor integrated circuit includes a delay correction signal generator 1000-1 and a column address strobe latency control multiplexer 1000-2.

The delay correction signal generator 1000-1 latches a signal obtained by delaying an input signal by a phase difference between a clock and a delay locked loop clock to generate a plurality of output enable signals.

The column address strobe latency control multiplexer selects an output enable signal corresponding to column address strobe latency among the plurality of output enable signals, using the signal obtained by delaying the input signal by a phase difference between the clock and the delay locked loo clock, and outputs the selected signal as the data output control signal.

The delay correction signal generator 1000-1 may include a delay correcting unit 100 and an output enable signal generating unit 200.

The column address strobe latency control multiplexer 1000-2 may include a signal selecting unit 300 and a multiplexer 400.

The delay correcting unit 100 delays an input signal by a phase difference between a clock and a delay locked loo clock and outputs the delayed signal. The output enable signal generating unit 200 latches an output signal of the delay correcting unit 100 in response to the delay locked loop clock to generate a plurality of output enable signals.

The signal selecting unit 300 generates a selection signal for selecting an output enable signal corresponding to column address strobe latency among the plurality of output enable signals, using the output signal of the delay correcting unit 100.

The multiplexer 400 selects one of the plurality of enable signals in response to the selection signal and outputs the selected signal as the data output control signal.

The delay correcting unit 100 includes a counter 110, a multiplexer 120, a clock processing unit 130, a delay control unit 150, a frequency detecting unit 140, a delay unit 160, and a phase detecting unit 170.

The counter 110 outputs a plurality of count signals for setting at least two operation periods. The multiplexer 120 outputs one of a plurality of input signals including the clock according to the plurality of count signals. The clock processing unit 130 buffers a clock and outputs the signals through different signal lines.

The delay unit 160 delays an output signal of the multiplexer 120 by a predetermined amount of time. The delay control unit 150 changes the delay time according to a phase detection signal. The frequency detecting unit 140 sets the delay time set by the delay unit 160 to an initial delay time according to the frequency detection of the clock.

The phase detecting unit 170 detects a phase difference between the output of the delay unit 160 and the delay locked loop clock and outputs the phase detection signal.

The counter 110 outputs a count reference signal cntin and first to third count signals SELDET, SELCNT, and SELCMD for setting first to third operation periods DETECT OPERATION, COUNT OPERATION, and COMMAND OPERATION in response to a semiconductor integrated circuit initializing signal (hereinafter, referred to as an initializing signal) MRS_EN. The count reference signal cntin is generated by using the initializing signal MRS_EN, is activated in synchronization with the internal clock, and is maintained during an active period.

When the first count signal SELDET is activated, the multiplexer 120 selects the internal clock iclk and outputs the selected signal. When the second count signal SELCNT is activated, the multiplexer 120 selects the count reference signal cntin and outputs the selected signal. When the third count signal SELCMD is activated, the multiplexer 120 selects the read command rd_cmd and outputs the selected command.

The clock processing unit 130 buffers the internal clock iclk and outputs first to third clocks clk1, clk2, and clk3 that have the same actual phase and period, but are used for different purposes.

Figure 6:
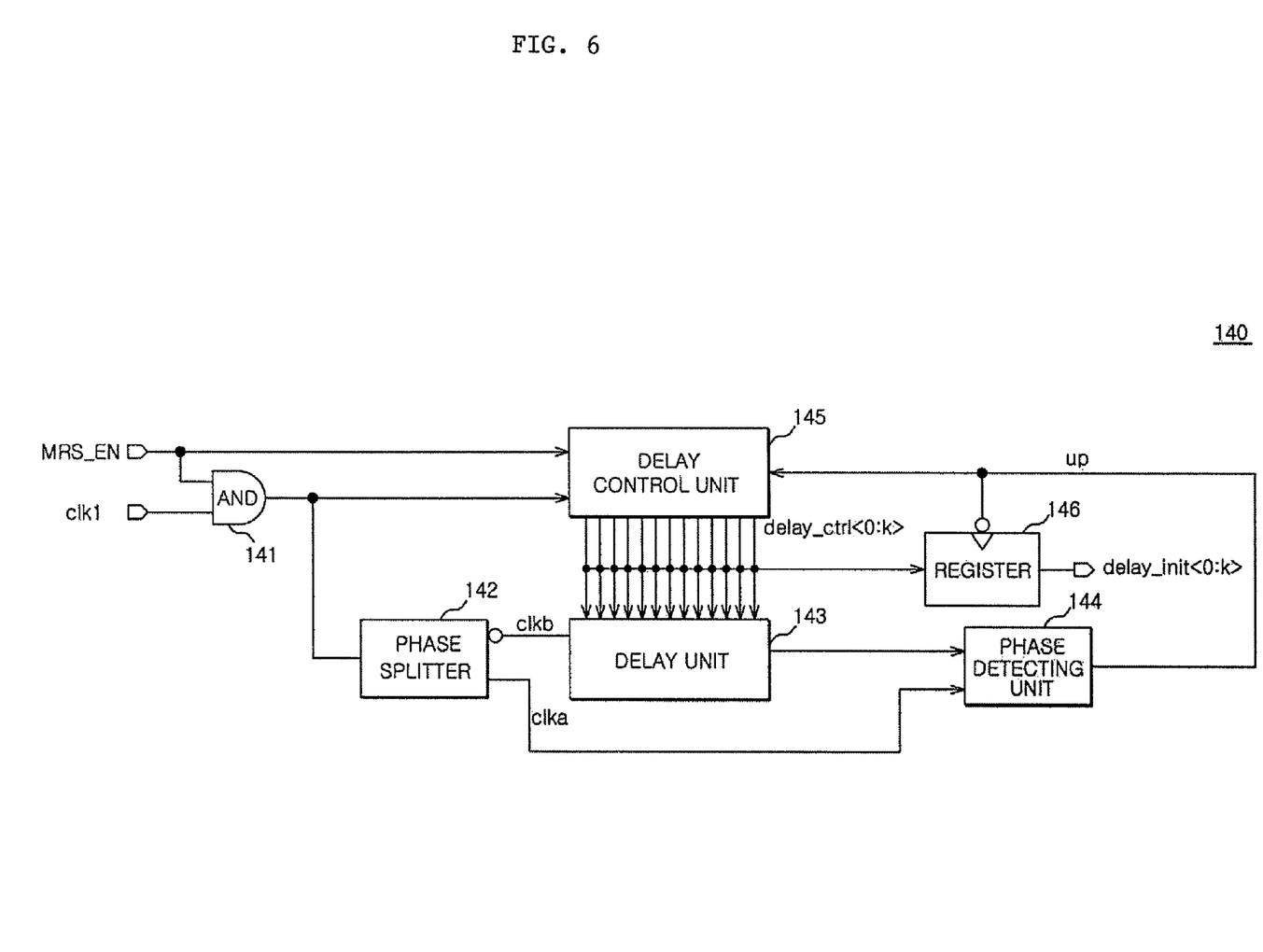
FIG. 6 is a block diagram illustrating a frequency detecting unit shown in FIG. 5.

As shown in FIG. 6, the frequency detecting unit 140 includes an AND gate 141, a phase splitter 142, a delay unit 143, a phase detector 144, a delay control unit 145, and a register 146.

The AND gate 141 receives the initializing signal MRS_EN and the first clock clk1 output from the clock processing unit 130.

The phase splitter 142 splits an output signal of the AND gate 141 into a first phase signal clkb and a second phase signal clka.

The delay unit 143 delays the first phase signal clkb by a time corresponding to a delay value delay_ctrl<0:k>.

The phase detector 144 detects a phase difference between an output signal of the delay unit 143 and the second phase signal clka and outputs a phase detection signal UP.

The delay control unit 145 changes the delay value delay_ctrl<0:k>according to the output of the phase detector 144.

The register 146 stores the delay value delay_ctrl<0:k>as an initial delay value delay_init<0:k> according to the phase detection signal UP.

Figure 7:
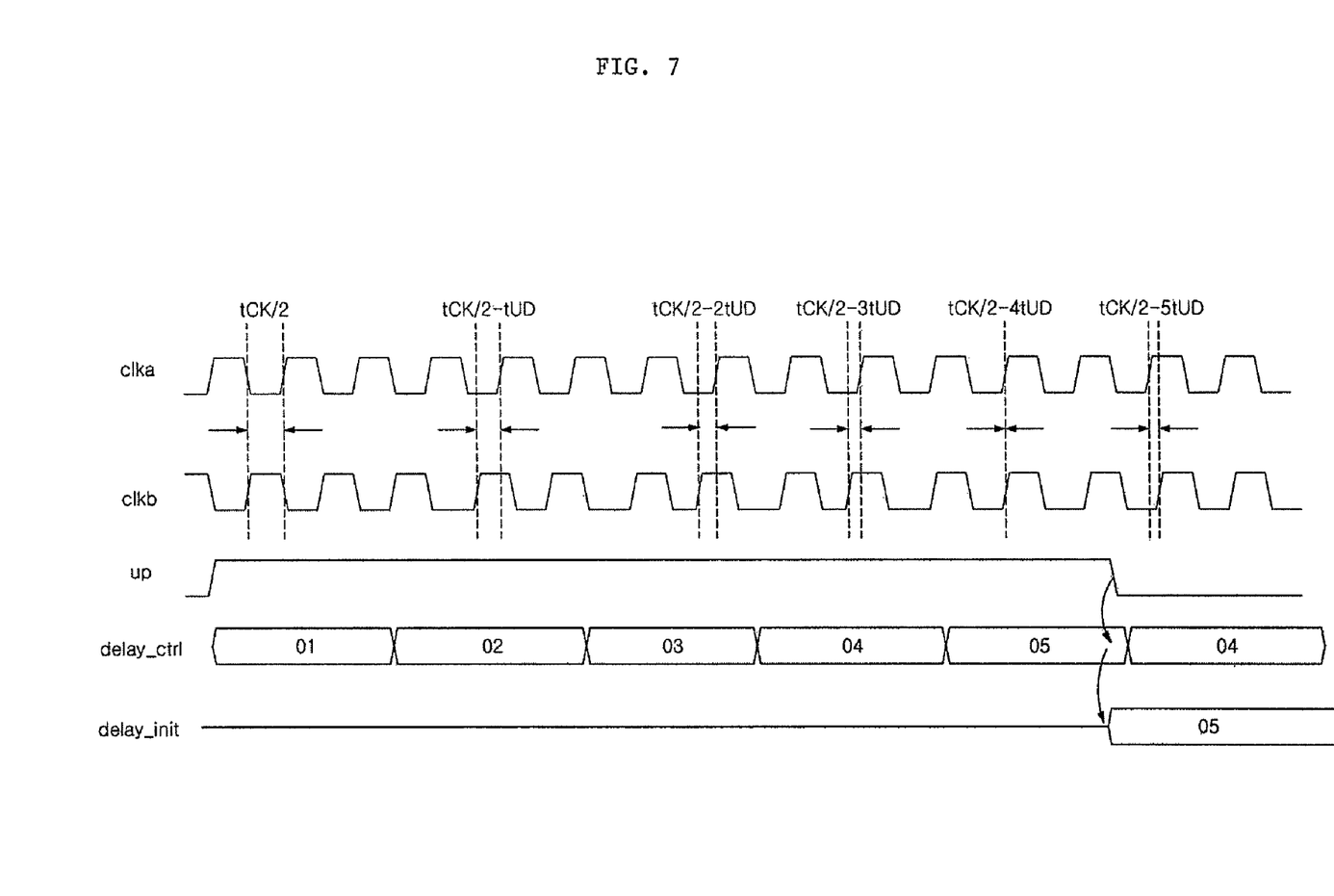
FIG. 7 is a timing chart illustrating the operation of the frequency detecting unit shown in FIG. 6.

Next, the operation of the frequency detecting unit 140 will be described with reference to FIG. 7.

When the initializing signal MRS_EN is activated, the phase splitter 142 splits the first clock clk1 into the first phase signal clkb and the second phase signal clka.

The delay unit 143 delays the first phase signal clkb by a time corresponding to the delay value delay_ctrl<0:k>, and outputs the delayed signal. The delay value delay_ctrl<0:k> is 1 at the time of an initial operation.

The phase detector 144 compares the phase of the first phase signal clkb delayed by the delay unit 143 with the phase of the second phase signal clka, and outputs the phase detection signal UP at a high level. Since the phase of the first phase signal clkb is opposite to the phase of the second phase signal clka, a phase difference between the first phase signal clkb and the second phase signal clka at the beginning is half the period tCK.

The delay control unit 145 increases the delay value delay_ctrl<0:k>to 2 according to the high-level phase detection signal UP.

The delay unit 143 delays the first phase signal clkb according to the increased delay value delay_ctrl<0:k> of 2, and outputs the delayed signal. Therefore, the first phase signal clkb is delayed by a unit delay time tUD.

For example, assuming that the sum of five delay times tUD is larger than half the period tCK, the delay value delay_ctrl<0:k> increases to 5, and the phase detector 144 outputs a low-level phase detection signal UP. Then, the delay value fluctuates back-and-forth to 4 and 5.

The register 146 latches the delay value delay_ctrl<0:k> at a falling edge of the phase detection signal UP, and thus the initial delay value delay_init<0:k> is fixed to 5. The first and second phase signals clkb and clka have the same period as the first clock clk1, and the first clock clk1 is identical to the internal clock iclk, so that half of one period tCK of the internal clock iclk is smaller than 5tUD.

Referring to FIG. 5 again, the delay control unit 150 changes a delay value delay_reg<0:k> according to the phase detection signal output from the phase detecting unit 170, using the second clock clk2 output from the clock processing unit 130 during a period for which the first count signal SELDET output from the counter 110 is activated. The delay unit 150 operates in the same manner as that in which the delay control unit operate, which has been described with reference to FIG. 6. The delay value delay_reg<0:k> of the delay control unit 150 is initialized by the initial delay value delay_init<0:k> output from the frequency detecting unit 140.

The delay unit 160 delays an output signal mux_out of the multiplexer 120 by a time tVDL corresponding to the delay value delay_reg<0:k>.

The phase detecting unit 170 compares the phase of a delay correction unit srdcmd with the phase of the delay locked loop clock rclk_dll and outputs the phase detection signal UP. The delay locked loop clock rclk_dll is synchronized with a rising edge of an external clock CLK.

The output enable signal generating unit 200 includes a plurality of flip-flops 210 that sequentially latch the delay correction signal srdcmd according to the delay locked loop clock fclk_dll and outputs a plurality of output enable signals oe<0:N−2>. The delay locked loop clock fclk_dll is synchronized with a falling edge of the external clock.

The signal selecting unit 300 includes a replica delay unit 310, a pulse generator 320, a counter 330, and a selection signal generator 340.

The replica delay unit 310 delays an output signal of the delay correcting unit 100 by a replica delay time tDO+tCMD corresponding to the delay time tDO of the delay locked loop clock fclk_dll and an input processing time tCMD of the read command rd_cmd during an active period of the second count signal SELCNT.

The pulse generator 320 generates a count pulse xclk on the basis of an output signal dly_out of the replica delay unit 310 and the count reference signal cntin.

The counter 330 counts the count pulse xclkp.

The selection signal generator 340 generates a selection signal SEL<0:N−2> for selecting one of the plurality of output enable signals oe<0:N−2> according to an output signal cout<0:4> of the counter 330 and column address strobe latency information CL<A:N>.

Figure 8:
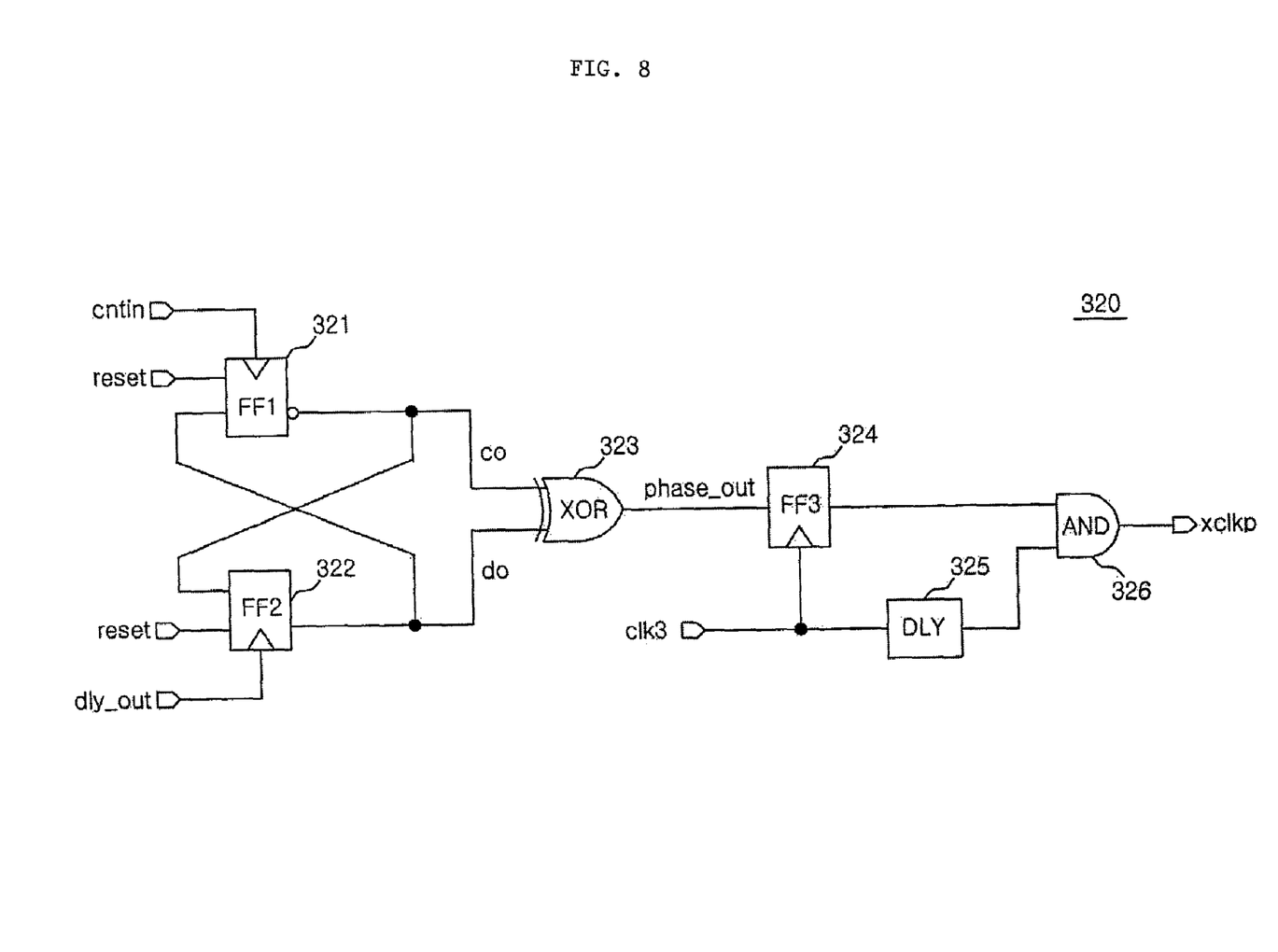
FIG. 8 is a block diagram illustrating a pulse generator shown in FIG. 5.

As shown in FIG. 8, the pulse generator 320 includes first to third flip-flops 321, 322, and 324, a XOR gate 323, a delay element 325, and an AND gate 326.

The first flip-flop 321 latches an input signal according to the count reference signal cntin, inverts the latched signal, and outputs the inverted signal co. The second flip-flop 322 latches an input signal according to the output signal dly_out of the replica delay unit 310 and outputs the signal do. The XOR gate 323 calculates an exclusive-OR operation of the output of the first flip-flop 321 co and the output of the second flip-flop 322 do. The third flip-flop 324 latches an output signal phase_out of the XOR gate 323 according to the third clock clk3 and outputs the latched signal. The delay element 325 delays the third clock clk3. The AND gate 326 calculates the multiplication of the delayed third clock clk3 and the output of the third flip-flop 324 to generate a count pulse xclkp.

Next, the operation of the pulse generator 320 will be described with reference to FIG. 9.

When the count reference signal cntin is activated, the first flip-flop 321 outputs a low-level signal co. When the output signal dly_out of the replica delay unit 310 is activated, the second flip-flop 321 outputs a high-level signal do.

The XOR gate 323 calculates an exclusive-OR operation of the output signal co of the first flip-flop 321 and the output signal do of the second flip-flop 322 to generate the out signal phase_out.

The third flip-flop 324 latches the output signal phase_out of the XOR gate 323 according to the third clock clk3 and outputs a period signal ntck for determining a period corresponding to a multiple of one period tCK.

The AND gate 326 outputs the third clock clk3 that has been delayed by the delay element 325 during an active period of the period signal ntck as the count pulse xclkp.

Figure 9:
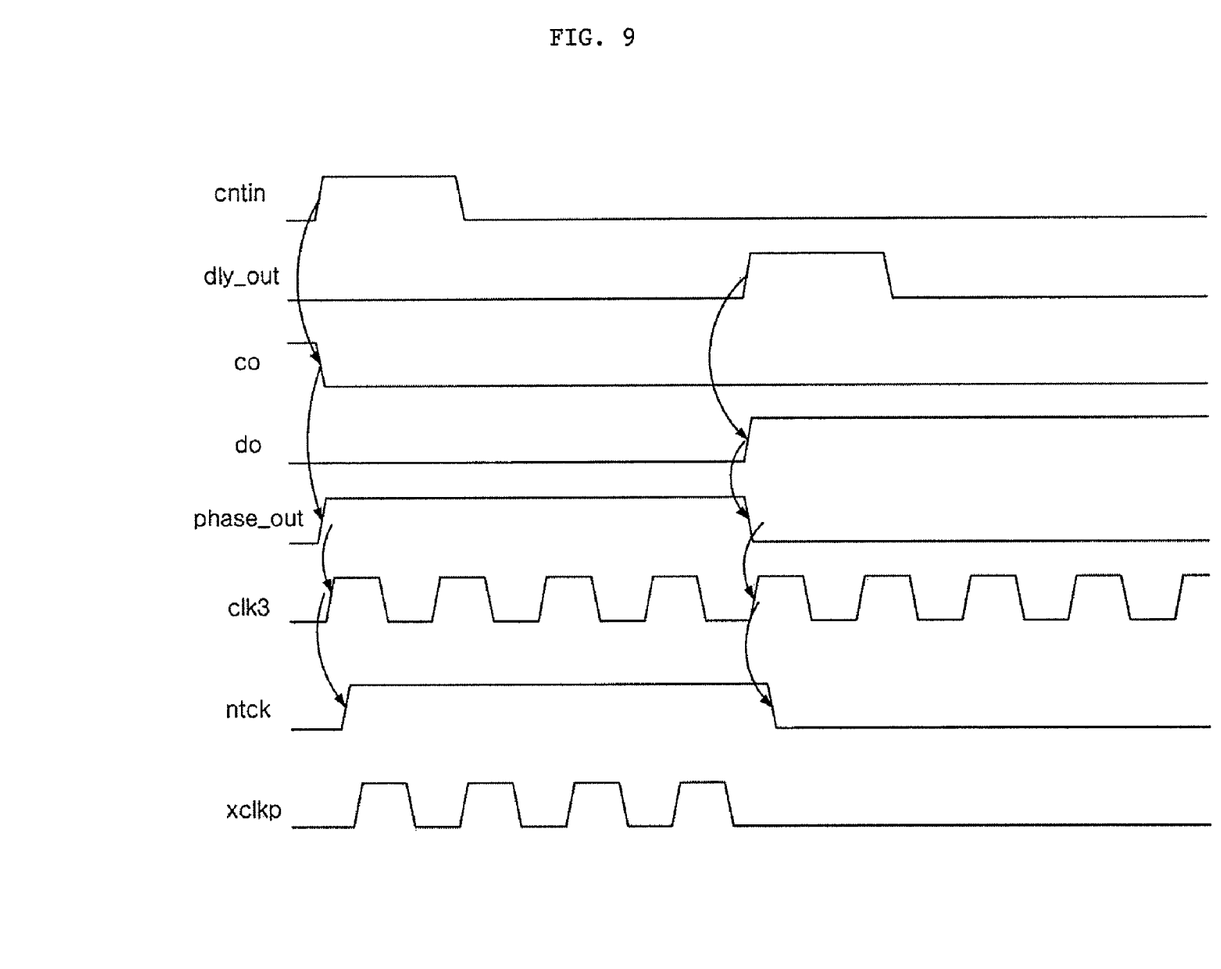
FIG. 9 is a timing chart illustrating the operation of the pulse generator shown in FIG. 8.

As can be seen from FIG. 9, when four count pulses xclkp exist during the active period of the period signal ntck, a phase difference between the internal clock iclk and the delay locked loop clock rclk_dll is 4tCK.

Figure 10:
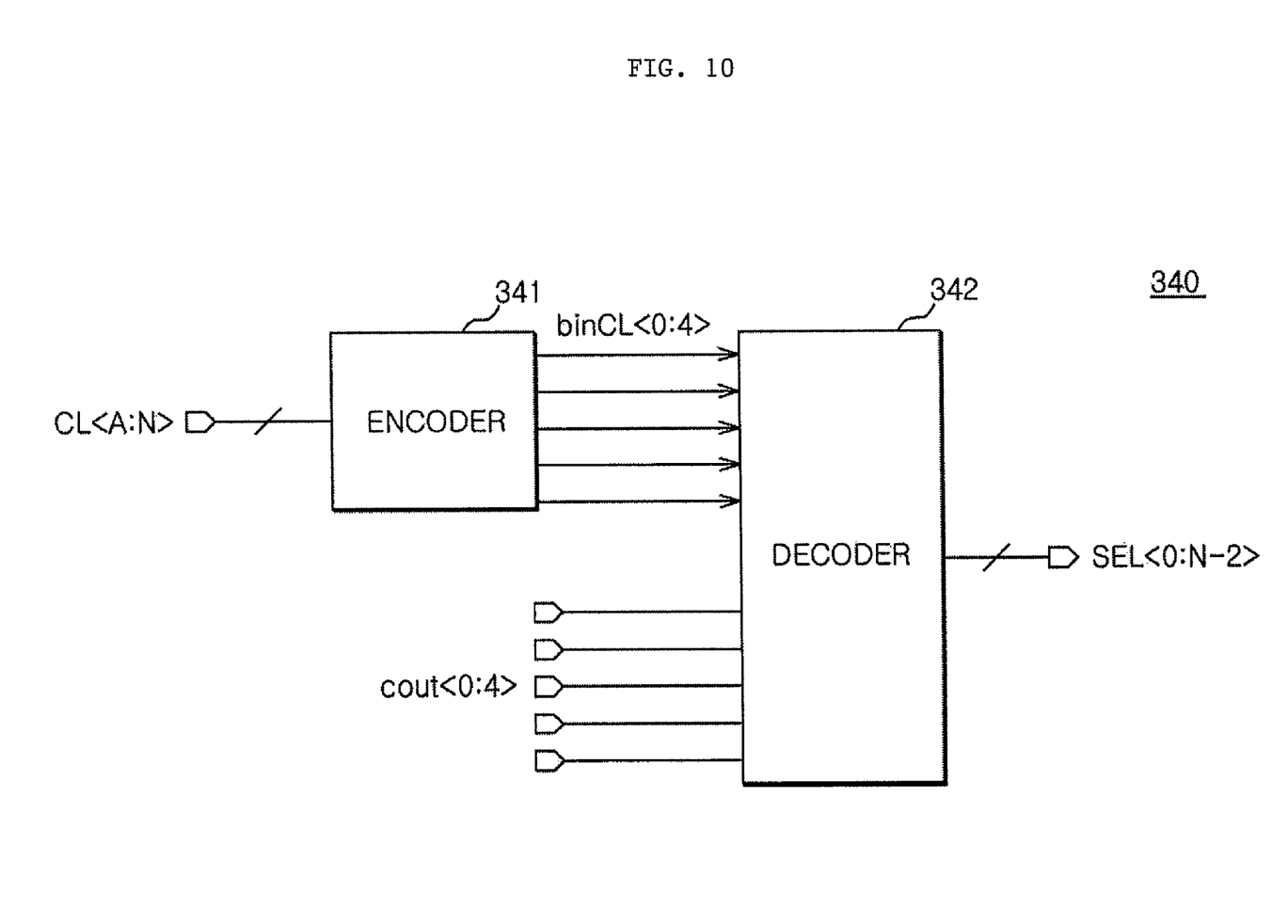
FIG. 10 is a block diagram illustrating a selection signal generator shown in FIG. 5.

As shown in FIG. 10, the selection signal generator 340 includes an encoder 341 and a decoder 342.

The encoder 341 encodes the column address strobe latency information CL<A:N> into a binary code. The decoder 342 decodes the difference between an output signal cout<0:4> of the counter 330 and an output signal binCL<0:4> of the encoder 341 and outputs the selection signal SEL<0:N−2>.

Referring to FIG. 5, the selection signal SEL<0:N−2> should be generated so as to select the output enable signal oe<0:N−2> when an n-th delay locked loop clock fclk_dll corresponding to the output signal cout<0:4> of the counter 330 latches the delay correction signal srdcmd. That is, the selection signal SEL<0:N−2> should be output so as to be matched with the delay locked loop clock fclk_dll that leads the column address strobe latency information CL<A:N> by an order n corresponding to the output signal cout<0:4> of the counter 330. Therefore, the selection signal generator 340 decodes the result obtained by subtracting the output signal cout<0:4> of the counter 330 from the column address strobe latency information binCL<A:N> that has been encoded into a binary code and outputs the selection signal SEL<0:N−2>.

Referring to FIG. 5 again, the multiplexer 400 selects one of the plurality of output enable signals oe<0:N−2> according to the selection signal SEL<0:N−2> and outputs the selected signal as the data output control signal outen.

Next, the operation of the circuit for generating a data output control signal for a semiconductor integrated circuit will be described with reference to FIG. 11.

When an initializing command is input from a mode resistor set (MRS) outside the semiconductor integrated circuit, the initializing signal MRS_EN is activated.

When the initializing signal MRS_EN is activated, the frequency detecting unit 140 of the delay correcting unit 100 determines the initial delay value delay_init<0:k>.

The counter 110 performs a counting operation in response to the initializing signal MRS_EN to sequentially activate the first to third count signals SELDET, SELCNT, and SEL-CMD.

The variable delay time tVDL is detected during the first operation period (DETECT OPERATION) for which the first count signal SELDET is in an active state.

That is, when the first count signal SELDET is activated, the delay value delay_reg<0:k> of the delay control unit 150 is set to the initial delay value delay_init<0:k>.

When the first count signal SELDET is activated, the delay control unit 150, the delay unit 160, and the phase detecting unit 170 detect the variable delay time tVDL and store the variable delay time as a delay value delay_reg<0:k> since the output signal mux_out of the multiplexer 120 is the internal clock iCLK.

It is determined how many times larger the delay time tVDL+tDO+tCMD is than one period tCK during the second operation period (COUNT OPERATION) for which the second count signal SELCNT is in an active state, and the column address strobe latency information CL<A:N> is used to generate the selection signal SEL<0:N−2>.

The output signal mux_out of the multiplexer 120 is a synchronized count reference signal cntin by an internal clock signal iclk. Therefore, the delay unit 160 delays the count reference signal cntin by a delay value delay_reg<0:k> corresponding to the variable delay time tVDL to generate the delay correction signal srdcmd.

The replica delay unit 310 delays the delay correction signal srdcmd by a time tDO+tCMD to generate a replica delay signal dly_out.

The pulse generator 320 outputs a count pulse xclk on the basis of the period signal ntck that is generated by using the count reference signal cntin and the replica delay signal dly_out.

The counter 330 counts the count pulse xclkp and outputs a count signal cout<0:4>.

The selection signal generator 340 subtracts the count signal cout<0:4> from the column address strobe latency information CL<A:N> to generate a selection signal SEL<0:N−2>.

Figure 11:
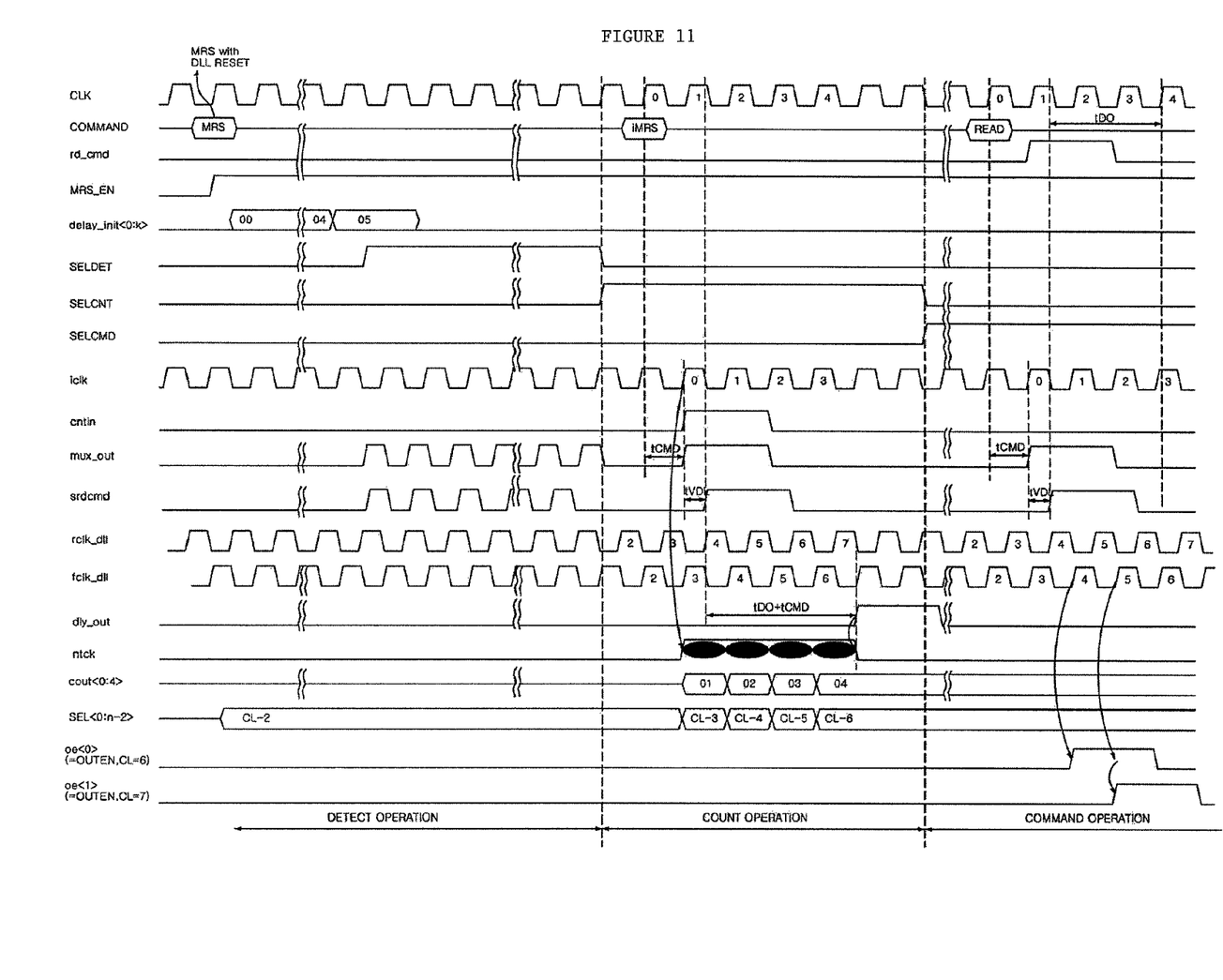
FIG. 11 is a timing chart illustrating the operation of the circuit for generating a data output control signal for a semiconductor integrated circuit according to the embodiment of the present invention.

As shown in FIG. 11, when the count signal cout<0:4> is 4 (4tCK), the selection signal SEL<0:N−2> corresponds to CL−6 obtained by subtracting 4 from CL−2. The reason why the selection signal SEL<0:N−2> is calculated from CL−2 is that the data output control signal outen should be output according to a clock that leads the clock according to the column address strobe latency information CL<A:N> by 2tCK in phase. In this case, it is assumed that a data pre-fetch method is applied to the semiconductor integrated circuit according to an embodiment of the present invention and the time required to convert parallel data into serial data is 2tCK.

The data output control signal outen is output by using the selection signal SEL<0:N−2> according to an internal read command rd_cmd that is generated by an external read command COMMAND during the third operation period (COMMAND OPERATION) for which the third count signal SELCMD is in an active state.

The output signal mux_output of the multiplexer 120 is the internal read command rd_cmd during the period for which the third count signal SELCMD is in an active state.

The delay unit 160 delays the internal read command rd_cmd by a delay value delay_reg<0:K> corresponding to the variable delay time tVDL to generate the delay correction signal srdcmd.

The output enable signal generating unit 200 sequentially latches the delay correction signal srdcmd according to the delay locked loop clock fclk_dll to output a plurality of output enable signals oe<0:N−2>.

The multiplexer 400 selects an output enable signal that is latched to the delay locked loop clock fclk_dll corresponding to the selection signal SEL<0:N−2> among the plurality of output enable signals oe<0:N−2> according to the selection signal SEL<0:N−2> and outputs the selected signal as a data output control signal outen.

For example, when CL is 6 and the count signal cout<0:4> is 4 (4tCK), the selection signal SEL<0:N−2> is a zeroth selection signal SEL<0> corresponding to CL−6. Therefore, the multiplexer 400 selects a zeroth output enable signal oe<0>, which is the output enable signal oe<0:N−2> corresponding to the zeroth selection signal SEL<0>, and outputs the selected signal as the data output control signal outen.

For example, when CL is 7 and the count signal cout<0:4> is 4 (4tCK), the selection signal SEL<0:N−2> is a first selection signal SEL<1> corresponding to CL−7. Therefore, the multiplexer 400 selects a first output enable signal oe<1>, which is the output enable signal oe<0:N−2> corresponding to the first selection signal SEL<1>, and outputs the selected signal as the data output control signal outen.

According to an embodiment of the present invention, a method of detecting the variable delay time tVDL and compensating for the detected delay time is used. Therefore, it is possible to operate the circuit for generating a data output control signal without satisfying tCK>tND+tS+tH and thus widen an operable frequency range.

Further, without correcting a delay error through a delay element modeling a delay, a value that is tCK times larger than the phase difference between the internal clock and the delay locked loop clock is calculated, and a data output control signal is output using a delay locked loop clock corresponding to the calculated value. Therefore, it is possible to minimally reduce a phase error and improve the performance of a circuit for generating a data output control signal.

In addition, it is not necessary to provide a plurality of delay chains and flip-flops for each CL, which makes it possible to reduce a circuit layout area.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A method of generating a data output control signal for a semiconductor integrated circuit, comprising:
    detecting a first phase difference between a clock and a delay locked loop clock;
    calculating a third phase difference between the clock and the delay locked loop clock, using the first phase difference and a second phase difference obtained by processing the delay locked loop clock and a read command;
    sequentially latching a signal obtained by delaying the read command by a time corresponding to the first phase difference according to the delay locked loop clock to generate a plurality of signals; and
    selecting one of the plurality of signals corresponding to the third phase difference and column address strobe latency information and outputting the selected signal as the data output control signal.

2. The method of claim 1,
    wherein the first phase difference is a phase difference between adjacent clock pulses among clock pulses of the clock and the delay locked loop clock.

3. The method of claim 1,
    wherein the second phase difference is a phase difference between clock pulses in the same order among clock pulses of the clock and the delay locked loop clock.

4. The method of claim 1,
    wherein the detecting of the first phase difference includes:
    comparing a phase of the delay locked loop clock with the phase of a clock;
    changing a delay register value according to a result of the comparison and delaying the clock by a time corresponding to the delay register value; and
    varying the delay register value until the phase of the delay locked loop clock is equal to the phase of the clock and storing the delay register value.

5. The method of claim 4,
    wherein the delay locked loop clock is synchronized with a rising edge of an external clock.

6. The method of claim 4,
    wherein the detecting of the first phase difference further includes:
    detecting a frequency of the clock to obtain a detected frequency;

setting an initial delay register value corresponding to the detected frequency; and initializing the delay register value to the initial delay register value according to a semiconductor integrated circuit initializing signal.

7. The method of claim 6,
wherein the semiconductor integrated circuit initializing signal is a mode register set signal.

8. The method of claim 1,
wherein the calculating of the third phase difference includes:
counting clock pulses of the clock generated for a time corresponding to the sum of the first phase difference and the second phase difference.

9. The method of claim 1,
wherein the outputting of the data output control signal includes:
selecting a signal synchronized with the delay locked loop clock in an order corresponding to the third phase difference and the column address strobe latency information among the plurality of signals to obtain a selected signal and outputting the selected signal as the data output control signal.

10. The method of claim 9,
wherein the delay locked loop clock is synchronized with a falling edge of an external clock.

* * * * *